(12) United States Patent
Lee et al.

(10) Patent No.: US 7,157,851 B2
(45) Date of Patent: Jan. 2, 2007

(54) SELF-CHARGING ORGANIC ELECTROLUMINESCENT DISPLAY DEVICE

(75) Inventors: Rong-Ho Lee, Hsinchu (TW); Chun-Te Lu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 97 days.

(21) Appl. No.: 10/699,730

(22) Filed: Nov. 4, 2003

(65) Prior Publication Data
US 2005/0023975 A1 Feb. 3, 2005

(30) Foreign Application Priority Data
Aug. 1, 2003 (TW) .................. 92121171 A

(51) Int. Cl.
*H05B 33/02* (2006.01)
(52) U.S. Cl. ...................... 313/506; 313/512
(58) Field of Classification Search ............... 313/504, 313/506, 512; 257/98
See application file for complete search history.

(56) References Cited

U.S. PATENT DOCUMENTS

| | | | | |
|---|---|---|---|---|
| 4,963,196 A | * | 10/1990 | Hashimoto | ............... 136/257 |
| 5,828,117 A | * | 10/1998 | Kondo et al. | ............... 257/458 |
| 6,028,327 A | | 2/2000 | Mizoguchi et al. | |
| 6,356,031 B1 | * | 3/2002 | Thagard et al. | .......... 315/169.3 |
| 2004/0119401 A1 | * | 6/2004 | Lee et al. | ................... 313/504 |
| 2004/0135268 A1 | * | 7/2004 | Frischknecht | ............... 257/788 |

FOREIGN PATENT DOCUMENTS

JP 08054479 A * 2/1996

* cited by examiner

*Primary Examiner*—Nimeshkumar D. Patel
*Assistant Examiner*—Matt Hodges
(74) *Attorney, Agent, or Firm*—Birch, Stewart, Kolasch & Birch, LLP

(57) ABSTRACT

A self-charging organic electroluminescent display is disclosed. A solar cell and an organic electroluminescent device are installed on a same substrate or different substrates. Using the photoelectric conversion property of the solar cell, the solar energy is converted into electrical energy and stored in a battery. Therefore, the electrical energy converted from the solar energy can be provided for the organic electroluminescent device to emit light, forming a self-charging organic electroluminescent display module.

4 Claims, 17 Drawing Sheets

SELF-CHARGING ORGANIC ELECTROLUMINESCENT DISPLAY DEVICE

This Nonprovisional application claims priority under 35 U.S.C. § 119 (a) on Patent Application No(s). 092121171 filed in TAIWAN on Aug. 1, 2003, the entire contents of which are hereby incorporated by reference.

BACKGROUND OF THE INVENTION

1. Field of Invention

The invention relates to an organic electroluminescent display device and, in particular, to a self-charging organic electroluminescent display device.

2. Related Art

The structure of an organic electroluminescent display 100 is shown in FIG. 1. It is mainly comprised of a substrate 110, a positive electrode 120, an organic electroluminescent film 130, a metal negative electrode 140, a glass packaging cover 150, and a packaging resin 160. When a voltage is imposed on the organic electroluminescent display, electrons and holes flow from the negative electrode 140 and the positive electrode 120 into the organic electroluminescent film 130 and combine into excitons there to emit light.

The structure of an organic solar cell is shown in FIG. 2. It is mainly comprised of a substrate 210, a transparent positive electrode 220, an organic solar energy absorption film 230, a metal negative electrode 240, a glass packaging cover 250, and a packaging resin 260. When sunlight shines on the solar cell, the organic solar energy absorption film 230 absorbs the solar energy and excites singlet excitons, i.e. an electron-hole pair. The electric field imposed on the positive electrode 220 and the metal negative electrode 240 separates the electron-hole pair into free electron and hole. They are connected to an external loop to generate electricity.

The structure of an inorganic solar cell is shown in FIG. 3. It is mainly comprised of a substrate 310, a transparent positive electrode 320, an inorganic P-type semiconductor 330, an inorganic N-type semiconductor 340, a metal negative electrode 350, a packaging resin 360, and a glass packaging cover 370. When sunlight shines on the solar cell, ionizations occur at the PN semiconductor junction to form electron-hole pairs. The generated electrons and holes flow toward the negative and positive electrodes, respectively. They are collected at the electrodes to provide a voltage. Finally, a conductive wire is used to excite singlet excitons, i.e. an electron-hole pair. The electric field imposed on the positive electrode 220 and the metal negative electrode 240 separates the electron-hole pair into free electron and hole. They are connected to an external loop to generate electricity.

The organic electroluminescent display is combined with an organic solar cell to form a light-emitting device. The U.S. Pat. No. 6,028,327 discloses a similar idea, as shown in FIG. 4. The structure of the organic electroluminescent display 1 includes a positive electrode 22, organic films 23, 24, and a negative electrode 25 formed on a substrate 21. The inorganic solar cell 2 is formed from a stack of three sets of solar cell units 3, 4, 5. It is combined with the light-emitting device using the negative electrode 25 as the common negative electrode. The films 25, 28, 31 in the inorganic solar cells 3, 4, 5 are negative electrodes, and the films 27, 30, 33 are positive electrodes. The inorganic films 26, 29, 32 are solar energy absorption films. The positive electrode 33 is covered with a second substrate 34. The inorganic solar cell 2, external circuits 11, 12, a control switch 15, and a battery 16 form a loop. When the inorganic solar cell absorbs the sunlight and converts it into electrical energy, the electrical energy is stored in the battery 16 via the external loop. When the organic electroluminescent display 1 needs electrical power, the electricity flows from the battery 16 into the light-emitting device via the circuits 11, 13 and the switch 15. Therefore, when the light-emitting device and the solar cell are combined using a common negative electrode, the solar cell cannot be charged at the same time when the display is in use.

Since the solar cell and the organic electroluminescent display have similar manufacturing processes, the solar energy absorption film or the organic electroluminescent film can be directly formed on the substrate of the positive electrode by coating or vacuum evaporation. Afterwards, the module is formed on the negative electrode by vacuum evaporation. The process finished after packaging.

SUMMARY OF THE INVENTION

In view of the foregoing, a primary objective of the invention is to provide a self-charging organic electroluminescent display, which combines a solar cell and an organic electroluminescent device on a same substrate or different substrates to form an organic electroluminescent display module. Through an external loop, one can obtain a self-charging organic electroluminescent display that uses the solar cell to obtain energy.

The invention discloses four distinct structures. The first embodiment is to form the solar cell and the organic electroluminescent display on two separate substrates, which are then attached together. The second embodiment is to stack the solar cell and the organic electroluminescent display in different areas of the same substrate. The third embodiment is to stack the solar cell and the organic electroluminescent display in the same area of the same substrate. The fourth embodiment is to form the solar cell and the organic electroluminescent display on opposite surfaces of a substrate. The above four embodiments can be combined with a circuit loop on a panel to form self-charging organic electroluminescent displays.

The organic electroluminescent display disclosed in the U.S. Pat. No. 6,028,327 has a similar structure as the third embodiment disclosed herein. However, the most significant difference between the invention and the prior art is that the display and solar cell of the invention do not combine by sharing a common negative electrode. Therefore, the invention can charge the solar cell at the same time of using the display.

Besides, the solar cell and the organic electroluminescent display are formed on the same or different substrates. Using an external loop, the invention can effectively control the charging function of the solar cell and the uses of the organic electroluminescent display. The organic electroluminescent display and the solar cell have similar manufacturing processes in materials and structures. Thus, the cost for mass production can be lowered.

Combining the solar cell and the organic electroluminescent display has the advantages of minimizing volumes and weights. A large substrate can be simultaneously formed with many sets of solar cells and organic electroluminescent displays, very suitable for making outdoor advertising panels. The organic solar cell is formed by stacking more than one set of organic solar cell unit in order to increase the photoelectric conversion efficiency.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

This specification discloses four embodiments. A circuit is designed on a panel so that after the solar cell absorbs solar energy and converts it into electricity, the electrical power is stored in a capacitor and conducted into an organic electroluminescent display through a switch. This forms an organic electroluminescent display that uses a solar cell.

First Embodiment

Figure 1:
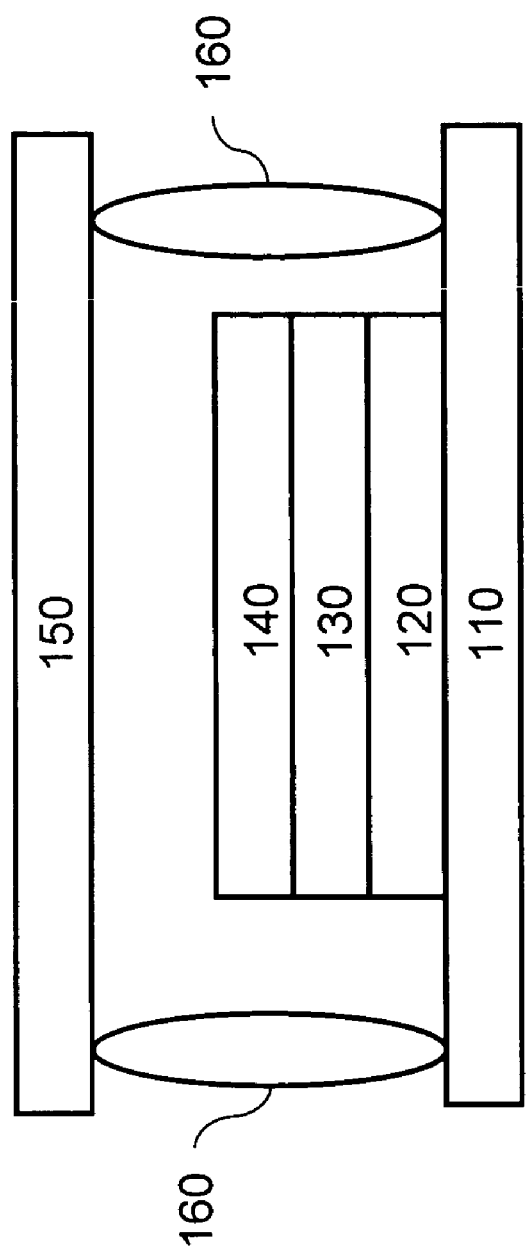
FIG. 1 is a schematic view of the structure a conventional organic electroluminescent display.
Figure 2:
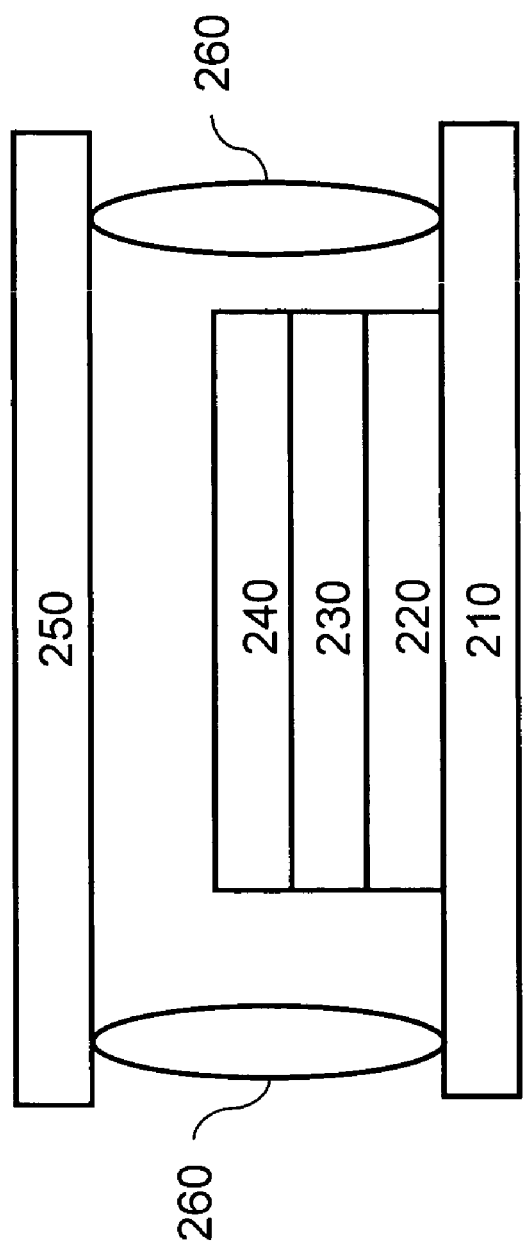
FIG. 2 is a schematic view of the structure of an organic solar cell.
Figure 3:
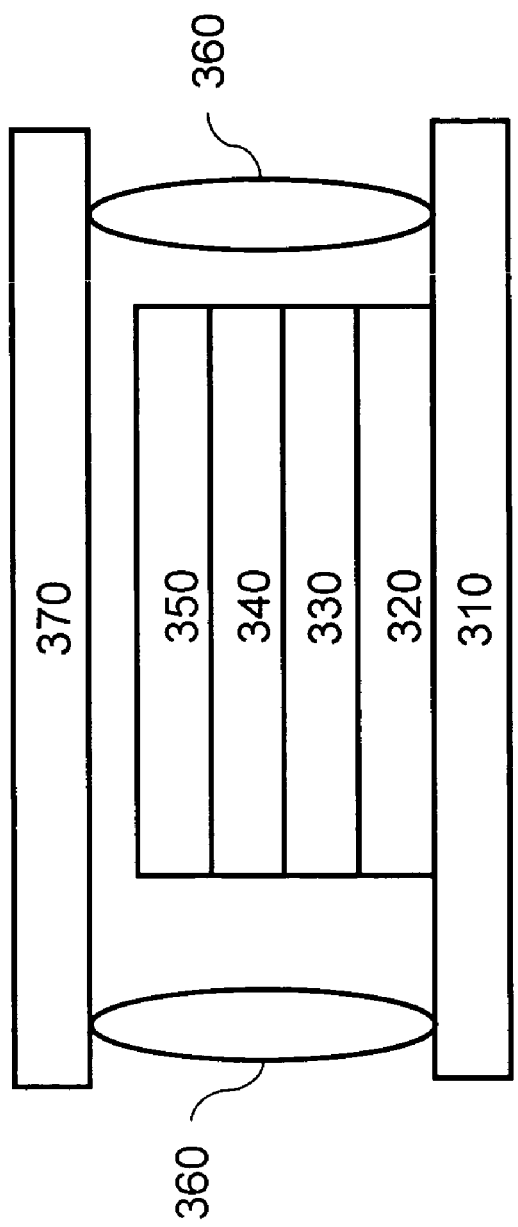
FIG. 3 is a schematic view of the structure of an inorganic solar cell.
Figure 4:
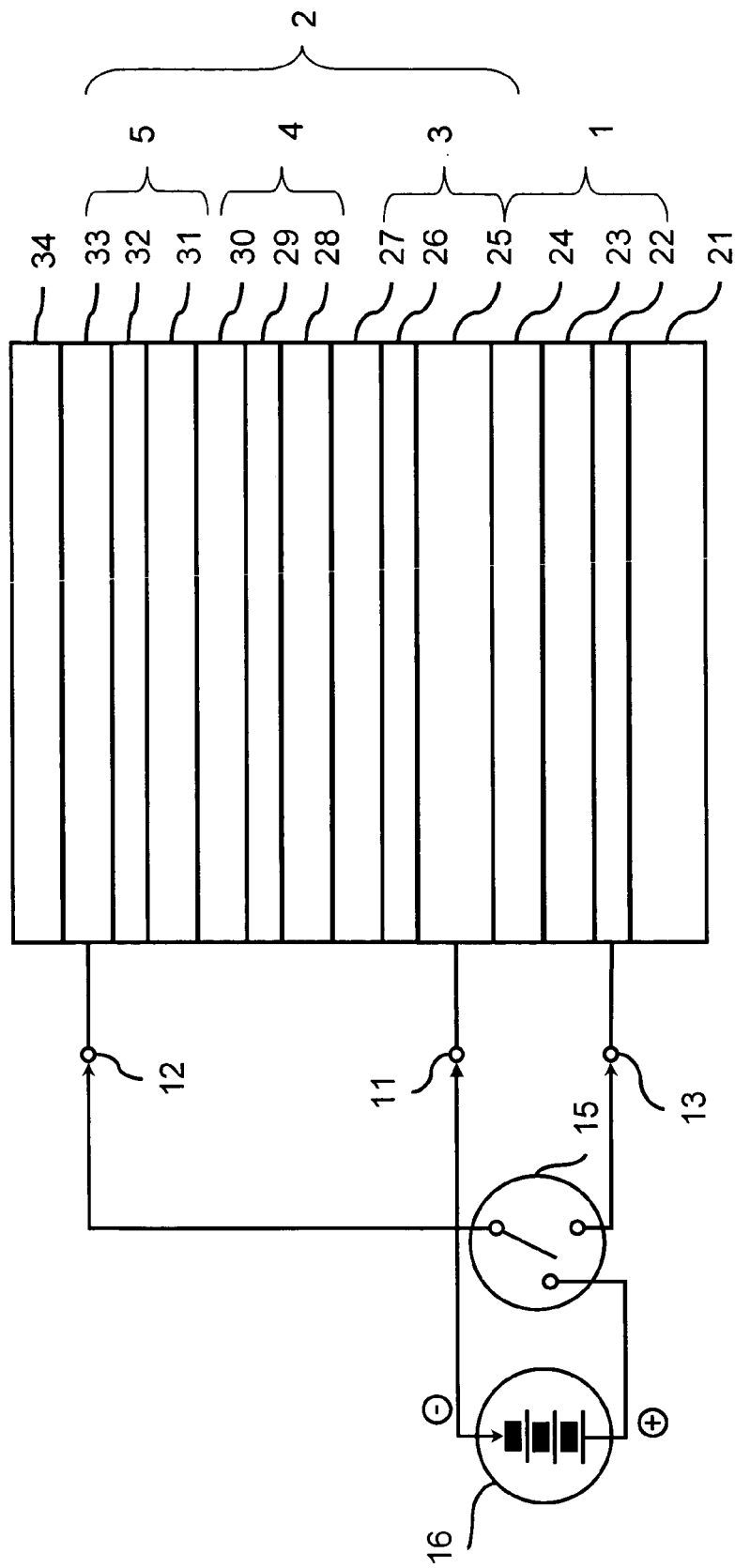
FIG. 4 is a schematic view of the stacked structure of conventional organic electroluminescent display and inorganic solar cell.
Figure 5:
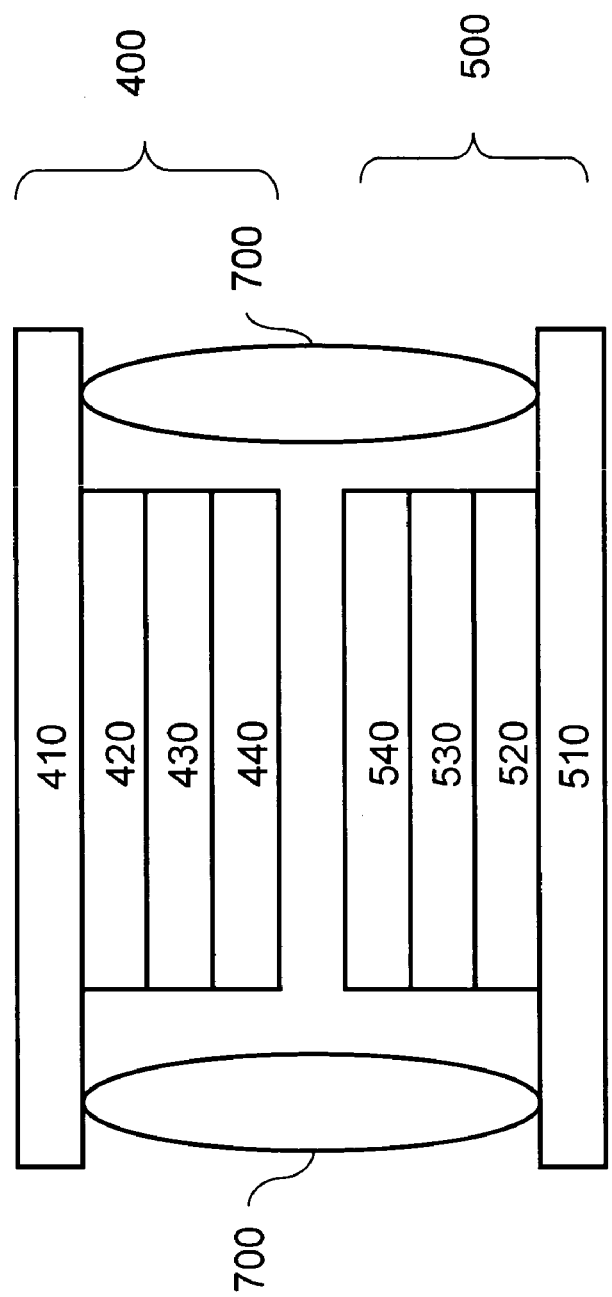
FIG. 5 is a schematic view of the first embodiment of the disclosed self-charging organic electroluminescent display that uses an organic solar cell.

FIG. 5 shows the first embodiment of the disclosed self-charging organic electroluminescent display. The organic solar cell and the organic electroluminescent display are formed on two separate substrates, which are then packaged into a single display module.

The self-charging organic electroluminescent display includes an organic solar cell 400 and an organic electroluminescent device 500. The organic solar cell 400 is comprised of a first substrate 410, a conductive film 420 as a positive electrode, an organic solar energy absorption film 430, and a conductive film 440 as a negative electrode. The organic electroluminescent device 500 is comprised of a second substrate 510, a conductive film 520 as a positive electrode, an organic electroluminescent film 530, and a conductive film 540 as a negative electrode.

In the organic solar cell 400, the first substrate 410 is made of glass, plastic, or ceramic materials. The positive electrode film 420 is made of ITO or IZO that has large work functions. The organic solar energy absorption film 430 mainly includes a film that transmits electrons and holes to the external loop. It is made of polymer films (MEH-PPV), small molecule films (HD, PV, MC) or organic/inorganic nano-composite materials (MEH-PPV/TiO2, MEH-PPV/C60). The negative electrode 440 is made of metals (Mg, Ag, LiF, Al, Ca) and their fluorides that have small work functions.

In the organic electroluminescent device 500, the second substrate 510 is made of glass, plastic, or ceramic materials. The positive electrode film 520 is made of ITO or IZO that has large work functions. The organic electroluminescent film 530 comprises a polymer film or a small molecule film. It mainly contains such organic films as the hole insertion layer (CuPC), the hole transporting layer (NPB, PEDOT), the luminous layer (C545T, DCM2, Alq3, MEH-PPV, PAF), and the electron transporting layer (Alq3). The negative electrode 540 is made of metals (Mg, Ag, LiF, Al, Ca) and their fluorides that have small work functions.

The manufacturing process starts with forming positive electrode film 420 on the first substrate 410. Afterwards, the organic solar energy absorption film 430 and the negative electrode film 440 are coated on the positive electrode film 420, forming the organic solar cell 400. For the organic electroluminescent device 500, the positive electrode film 520 is first coated on the second substrate 510. Afterwards, the organic electroluminescent film 530 and the negative electrode film 540 are coated on the positive electrode film 520, forming the organic electroluminescent device 500. Finally, the organic cell 400 and the organic electroluminescent device 500 are packaged using a packaging adhesive 700 into a self-charging organic electroluminescent display.

When sunlight shines on the absorption film 430 via the first substrate 410, light is converted into electricity. It is connected to the organic electroluminescent film 530 in the organic electroluminescent device 500 via an external loop (not shown). Electroluminescent light is generated and emitted from the second substrate 510.

Figure 6:
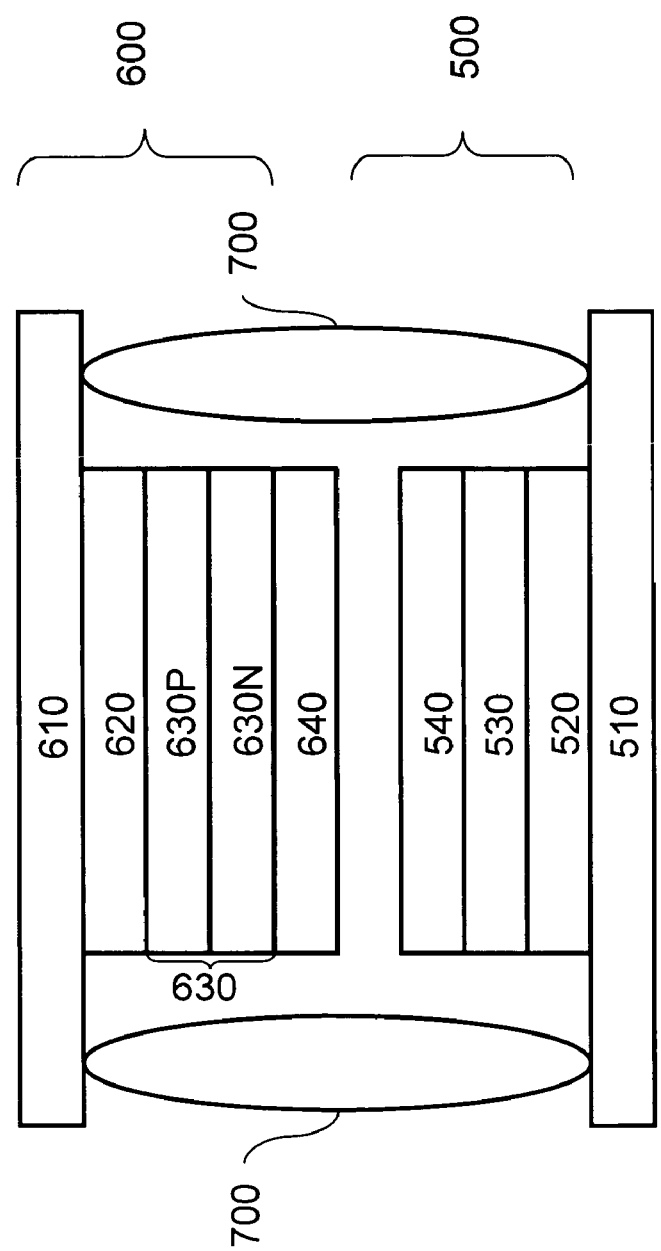
FIG. 6 is a schematic view of the first embodiment of the disclosed self-charging organic electroluminescent display that uses an inorganic solar cell.

The solar cell 400 in the first embodiment can be replaced by an inorganic solar cell that has a similar structure and manufacturing process. As shown in FIG. 6, the structure contains an inorganic solar cell 600 and an organic electroluminescent device 500. The inorganic solar cell 600 includes a first substrate, a conductive film 620 as a positive electrode, an inorganic solar energy absorption film 630, and a conductive film 640 as a negative electrode. The inorganic solar energy absorption film 630 is comprised of an inorganic P-type semiconductor film 630P and an inorganic N-type semiconductor film 630N. The organic electroluminescent device 500 is comprised of a second substrate 510, a conductive film 520 as a positive electrode, an organic electroluminescent film 530, and a conductive film 540 as a negative electrode.

In the inorganic solar cell, the first substrate 610 is made of glass, plastic, or ceramic materials. The positive electrode film 620 is made of ITO or IZO that has large work functions. The most commonly used material for the inorganic solar energy absorption film 630 is silicon. The silicon includes single-crystal silicon, polysilicon, and amorphous silicon. In addition, one can use chemical semiconductors, such as two-element chemicals (GaAs, CdS, CdSe, CdTe) or three-element chemicals (CuInSe2). There are many ways to make inorganic semiconductors. Different methods result in different types of silicon. One may also use such thin-film processes as PECVD, vacuum evaporation, sputtering, half-tone printing, and sintering to make chemical semiconductors for the solar cell. The negative electrode 640 is made of metals (Mg, Ag, LiF, Al, Ca) and their fluorides that have small work functions.

The manufacturing process starts with forming positive electrode film 620 on the first substrate 610. Afterwards, the inorganic P-type semiconductor film 630P, the inorganic N-type semiconductor film 630N, and the negative electrode film 640 are coated on the positive electrode film 620, forming the inorganic solar cell 600. The positive electrode film 520 is coated onto the second substrate 510 by evaporation. Afterwards, the organic electroluminescent film 530 and the negative electrode 540 are coated on the positive electrode film 520. Finally, the inorganic cell 600 and the organic electroluminescent device 500 are packaged using a packaging adhesive 700 into a self-charging organic electroluminescent display.

When sunlight shines on the inorganic solar energy absorption film 630 via the first substrate 610, light is converted into electricity. It is connected to the organic electroluminescent film 530 in the organic electroluminescent device 500 via an external loop. Electroluminescent light is generated and emitted from the second substrate 510.

Figure 7:
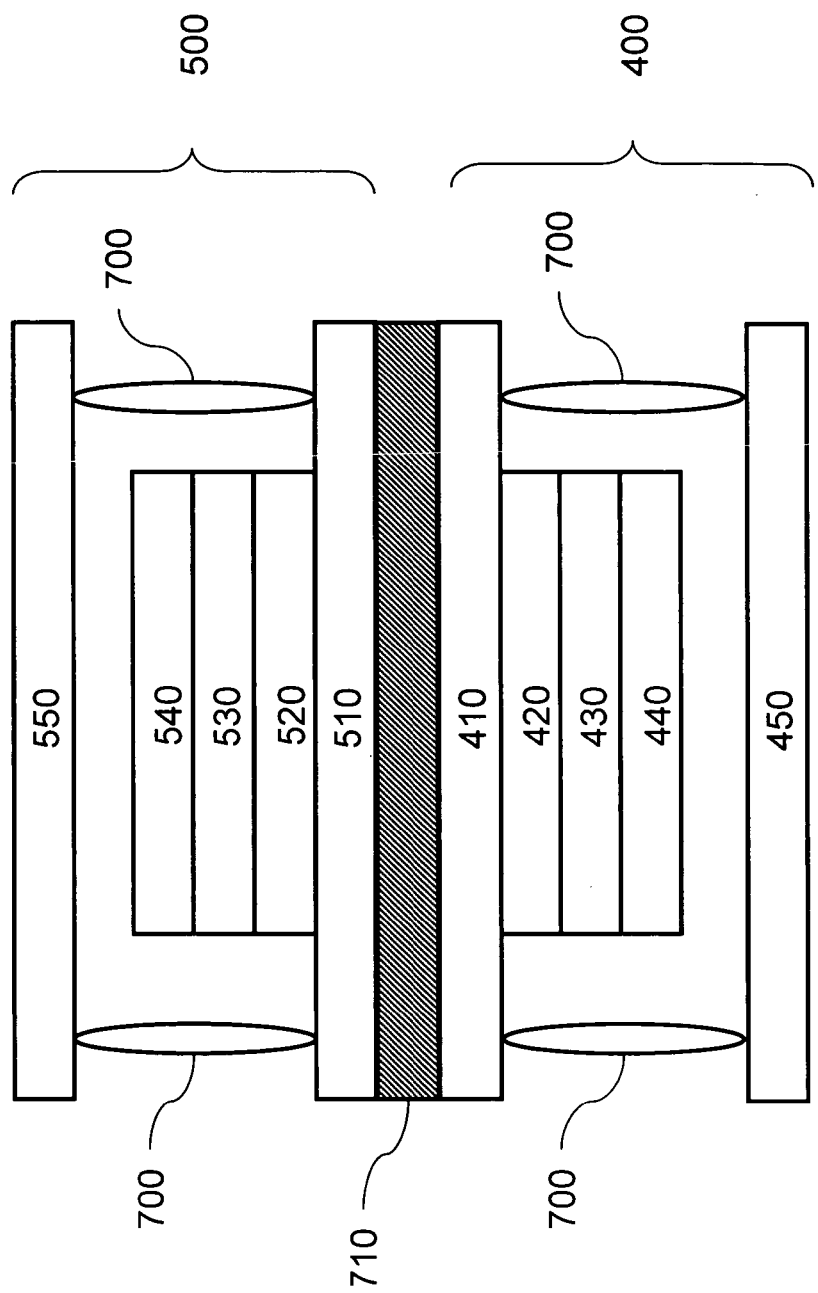
FIG. 7 is another schematic view of the first embodiment of the disclosed self-charging organic electroluminescent display that uses an organic solar cell.

The organic solar cell 400 and the organic electroluminescent device 500 in the first embodiment can be assembled into one shown in FIG. 7. Its structure is similar to that in FIG. 5. After the organic solar cell 400 is finished, a first cover 450 and a packaging adhesive 700 are used for packaging. Likewise, the organic electroluminescent device 500 also uses a second cover 550 and the packaging adhesive 700 for packaging. Finally, an opaque packaging adhesive 710 binds the organic solar cell 400 and the organic electroluminescent device 500. In the structure shown in FIG. 7, one has to control the thickness of the negative electrode films 440, 540 so that sunlight or electroluminescent light can penetrate through.

Figure 8:
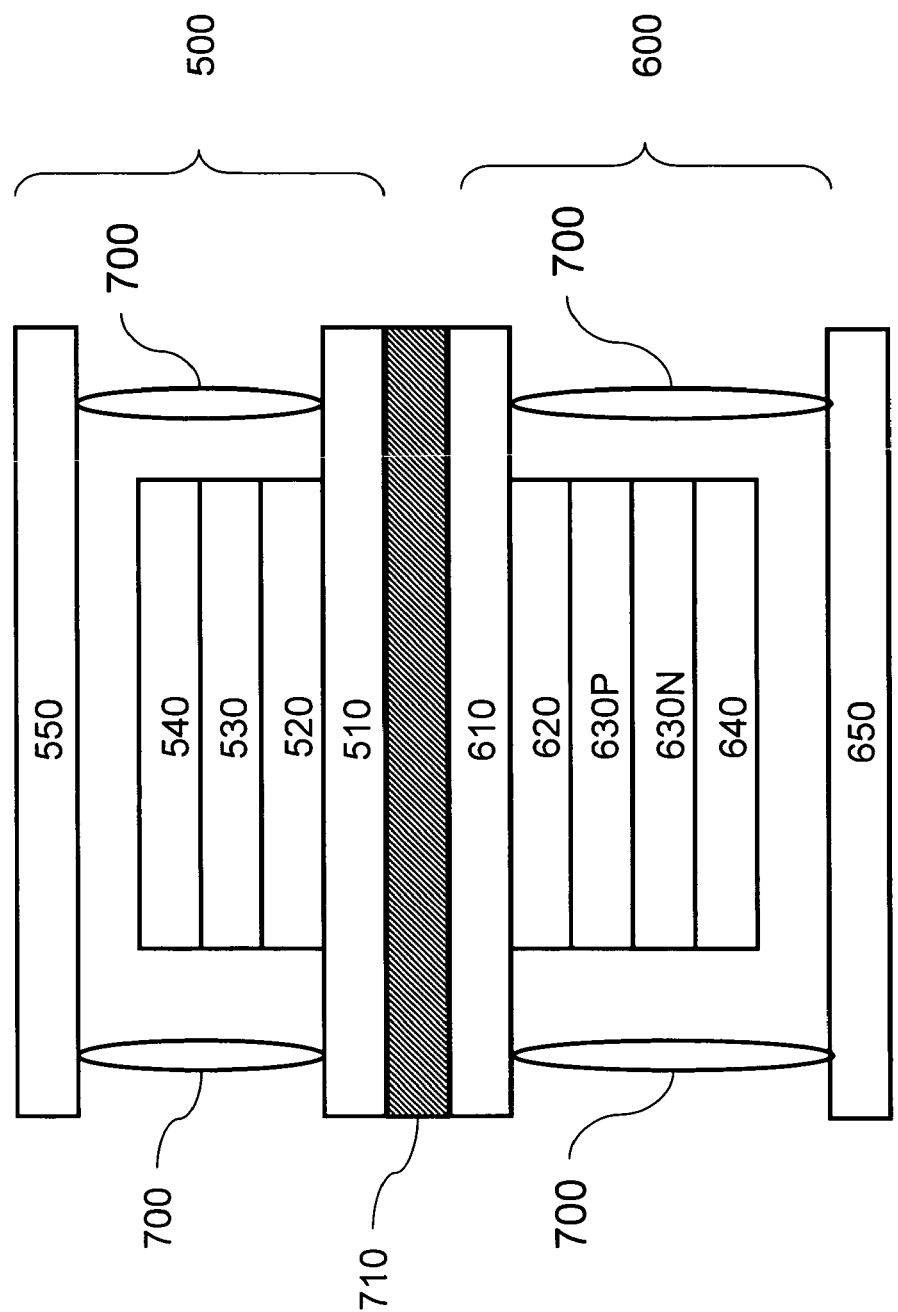
FIG. 8 is another schematic view of the first embodiment of the disclosed self-charging organic electroluminescent display that uses an inorganic solar cell.

The organic solar cell 400 in FIG. 7 can be similarly replaced by an inorganic solar cell. As shown in FIG. 8, the module contains an inorganic solar cell 600 and an organic electroluminescent device 500.

Its manufacturing process is similar to the one described before. After the inorganic solar cell 600 and the organic electroluminescent device 500 are formed, a first cover 650 and a packaging adhesive 700 are used for packaging. Likewise, the organic electroluminescent device 500 also uses a second cover 550 and a packaging adhesive 700 for packaging. Finally, an opaque packaging adhesive 710 binds the inorganic solar cell 600 and the organic electroluminescent device 500 together.

Second Embodiment

Figure 9:
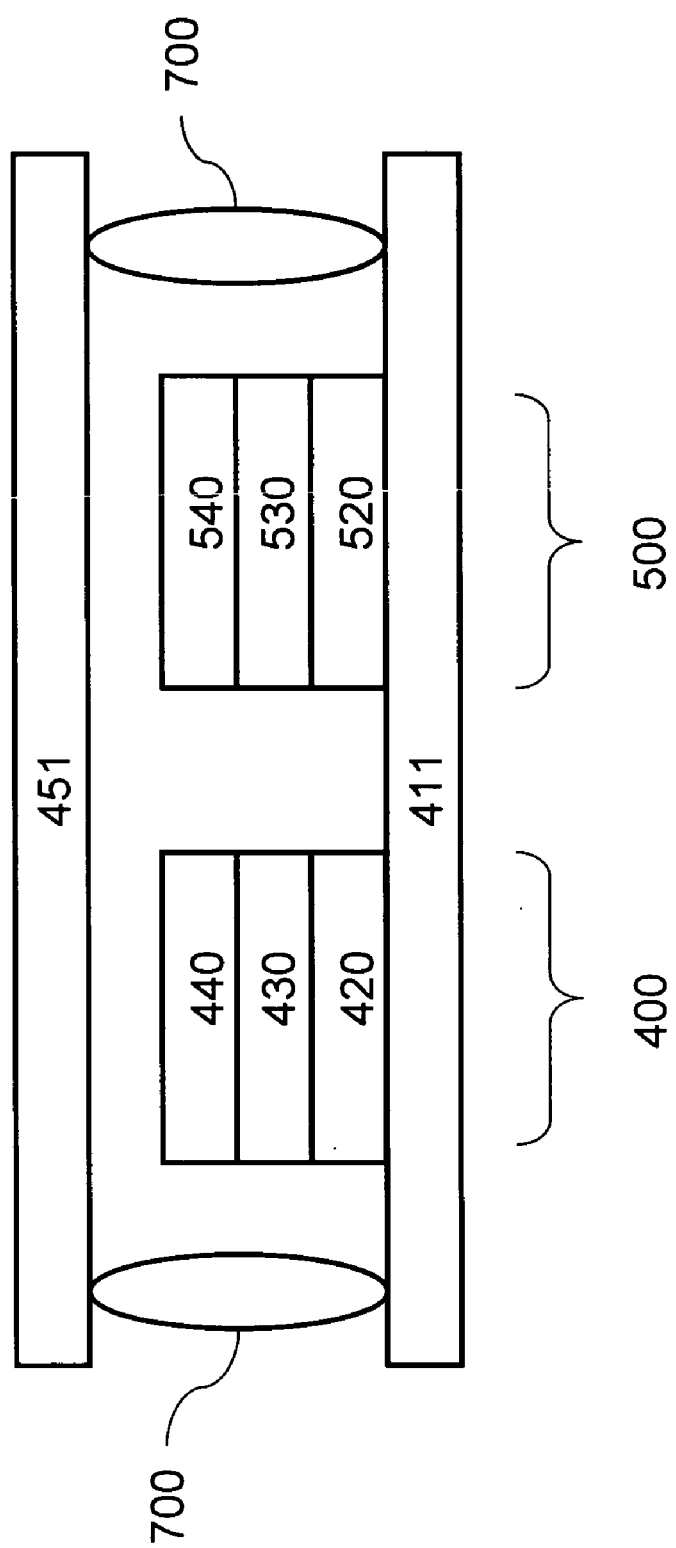
FIG. 9 is a schematic view of the second embodiment of the disclosed self-charging organic electroluminescent display that uses an organic solar cell.

Please refer to FIG. 9 for the second embodiment of the invention. An organic solar cell and an organic electroluminescent display are formed in different areas of the same substrate.

The organic solar cell 400 includes a common substrate 411, a positive electrode film 420, an organic solar energy absorption film 430, and a negative electrode film 440. The organic electroluminescent device 500 is similarly formed in a distinct area on the same surface of the sharing substrate 411. It further contains a positive electrode film 520, an organic electroluminescent film 530, and a negative electrode film 540.

The manufacturing process goes as follows. The positive electrode film 420, the organic solar energy absorption film 430, and the negative electrode film 440 are formed in order on the common substrate 411, forming the organic solar cell 400. In another area of the same substrate, the positive electrode film 520, the organic electroluminescent film 530, and the negative electrode film 540 are coated in order, forming the organic electroluminescent device 500. Finally, a common cover 451 and a packaging adhesive 700 are used for packaging.

Figure 10:
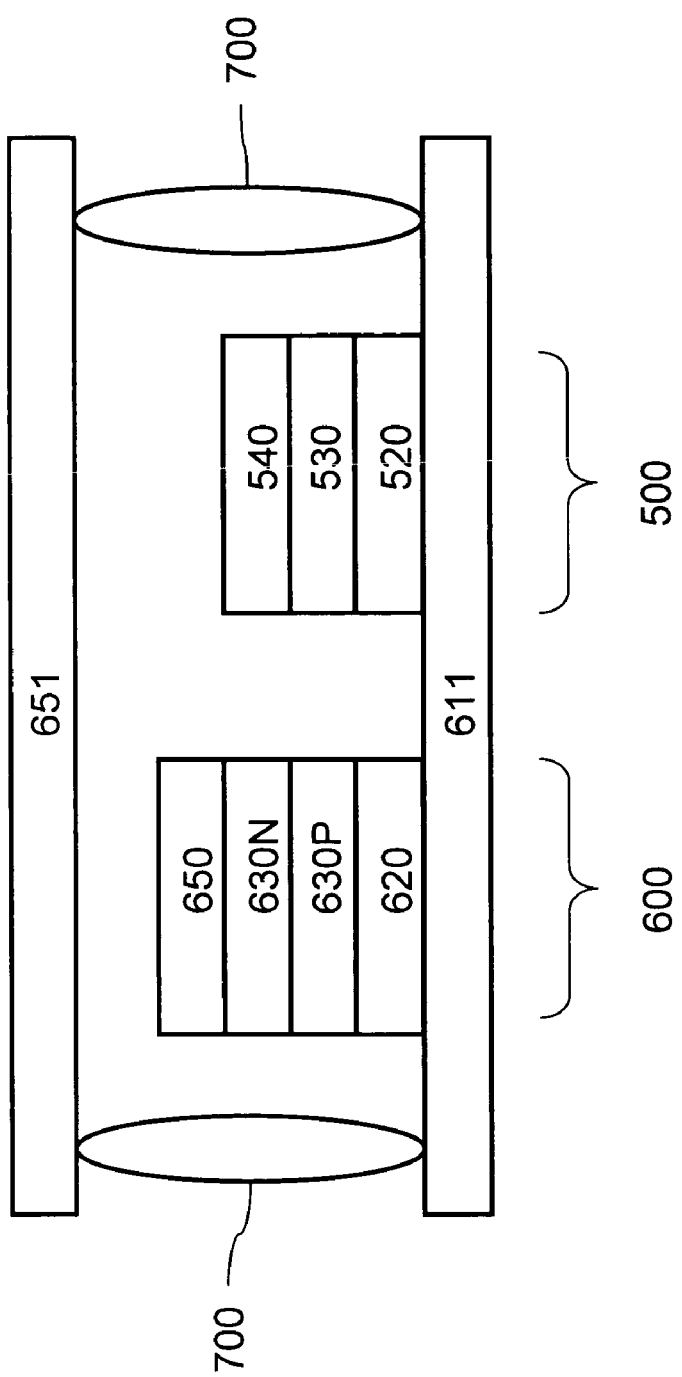
FIG. 10 is a schematic view of the second embodiment of the disclosed self-charging organic electroluminescent display that uses an inorganic solar cell.

The organic solar cell in the second embodiment can be replaced by an inorganic solar cell. As shown in FIG. 10, the structure contains an inorganic solar cell 600 and an organic electroluminescent device 500. The inorganic solar cell 600 includes a common substrate 611, a conductive film 620 as a positive electrode, an inorganic solar energy absorption film 630, and a conductive film 640 as a negative electrode. The inorganic solar energy absorption film 630 is comprised of an inorganic P-type semiconductor film 630P and an inorganic N-type semiconductor film 630N. The organic electroluminescent device 500 is formed on the same surface as the inorganic solar cell 600. It is comprised of a conductive film 520 as a positive electrode, an organic electroluminescent film 530, and a conductive film 540 as a negative electrode.

The manufacturing process goes as follows. The positive electrode film 620, the inorganic P-type semiconductor film 630P, the inorganic N-type semiconductor film 630N, and the negative electrode film 640 are formed in order on the common substrate 611, forming the inorganic solar cell 600. In another area of the same substrate 611, the positive electrode film 520, the organic electroluminescent film 530, and the negative electrode film 540 are coated in order. Finally, a common cover 651 and a packaging adhesive 700 are used for packaging the inorganic solar cell 600 and the organic electroluminescent device 500 into a self-charging organic electroluminescent display.

When sunlight shines on the energy absorption films 430, 630 via the common substrate 411, light is converted into electricity. It is connected to the organic electroluminescent film 530 in the organic electroluminescent device 500 via an external loop. Electroluminescent light is generated and emitted from the common substrates 411, 611.

Third Embodiment

Figure 11:
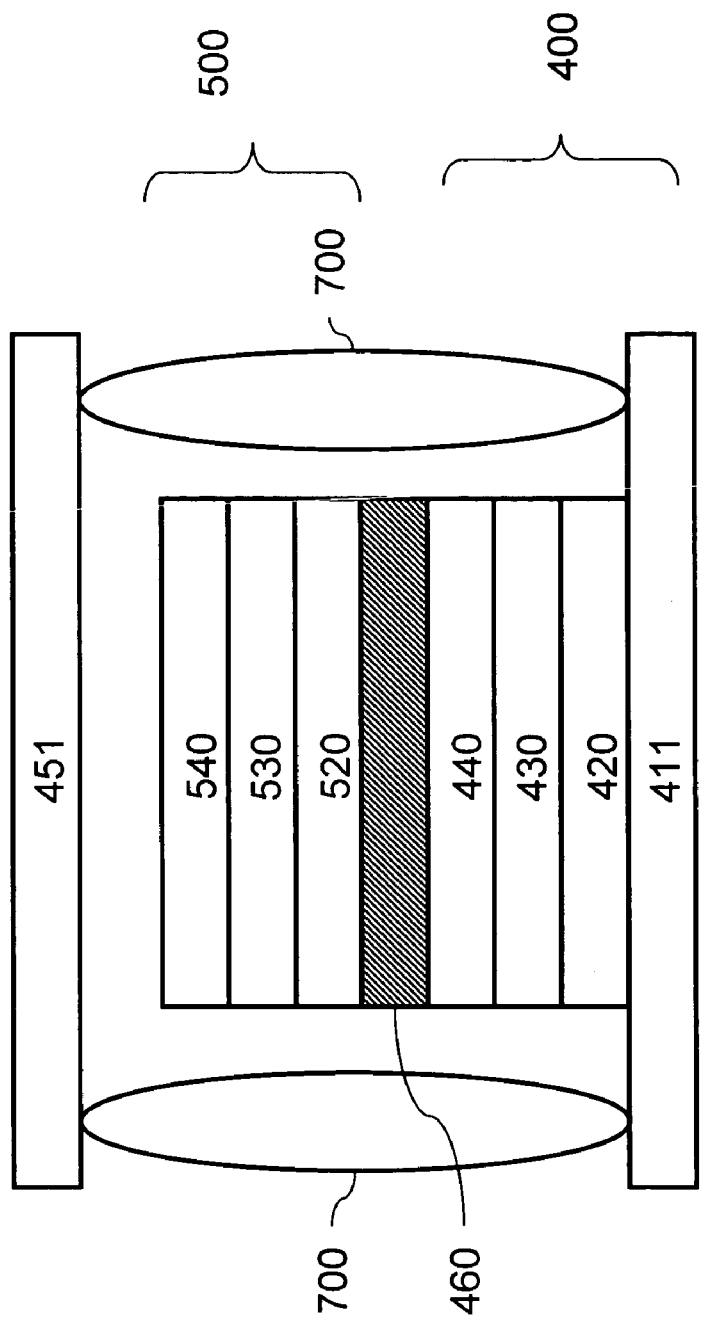
FIG. 11 is a schematic view of the third embodiment of the disclosed self-charging organic electroluminescent display that uses an organic solar cell.

Please refer to FIG. 11 for the third embodiment of the invention. An organic solar cell and an organic electroluminescent display are formed in the same area of a substrate.

The organic solar cell 400 includes a common substrate 411, a positive electrode film 420, an organic solar energy absorption film 430, and a negative electrode film 440. The organic electroluminescent device 500 contains a positive electrode film 520, an organic electroluminescent film 530, and a negative electrode film 540.

The manufacturing process goes as follows. The positive electrode film 420, the organic solar energy absorption film 430, and the negative electrode film 440 are formed in order on the common substrate 411, forming the organic solar cell 400. An opaque insulating layer 460 is formed above the conductive film 440 by evaporation. Afterwards, the positive electrode film 520, the organic electroluminescent film 530, and the negative electrode film 540 are coated in order, forming the organic electroluminescent device 500. The organic solar cell 400 and the organic electroluminescent device 500 are stacked in the same area. Finally, a common cover 451 and a packaging adhesive 700 are used for packaging.

Figure 12:
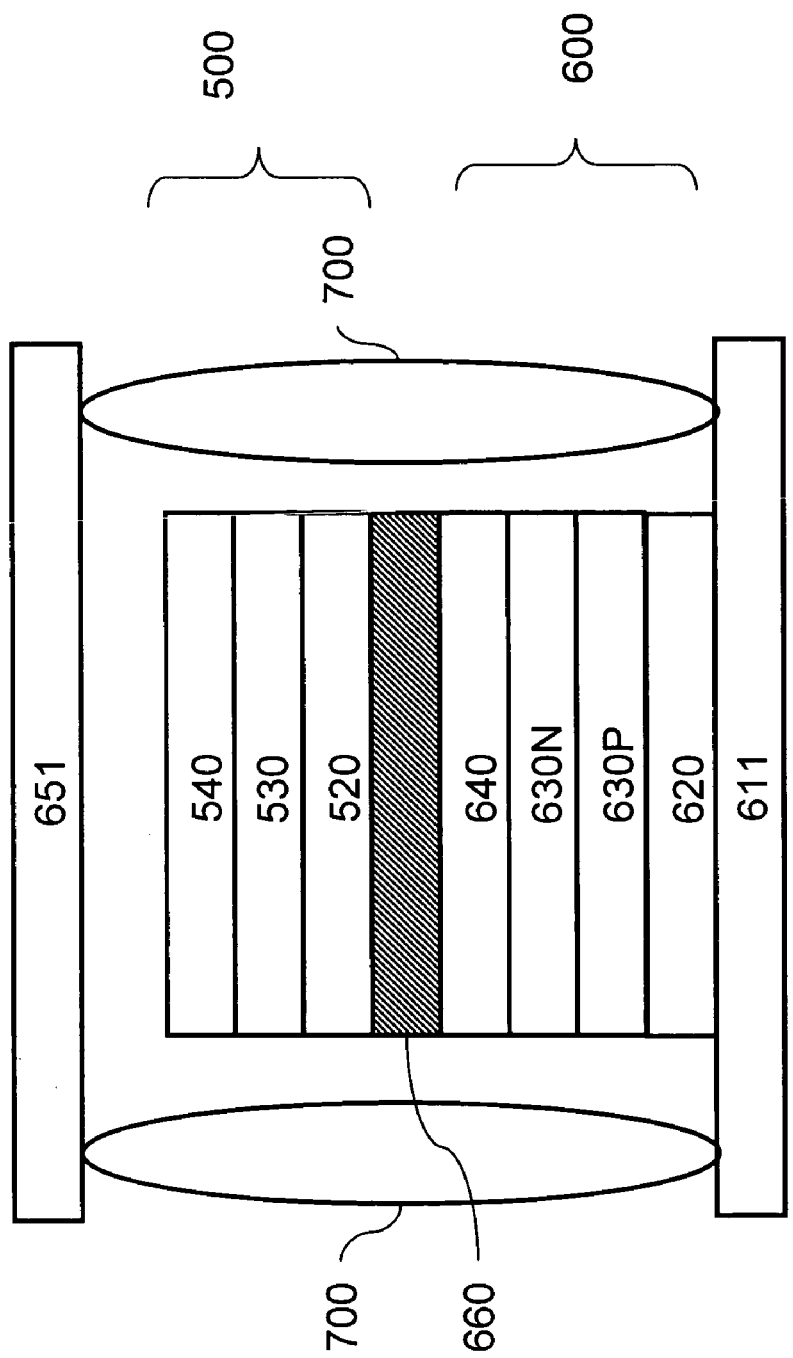
FIG. 12 is a schematic view of the third embodiment of the disclosed self-charging organic electroluminescent display that uses an inorganic solar cell.

The organic solar cell in the third embodiment can be replaced by an inorganic solar cell. As shown in FIG. 12, the composition of the inorganic solar cell is the same as before.

The positive electrode film 620, the inorganic P-type absorption film 630P, the inorganic N-type absorption film 630N, and the negative electrode film 640 are coated in order on the common substrate 611.

An opaque insulating layer 660 is coated above the conductive film 640. Afterwards, the positive electrode film 520, the organic electroluminescent film 530, and the negative electrode film 540 are coated in order, forming the organic electroluminescent device 500. Finally, a common cover 651 and a packaging adhesive 700 are used for packaging.

When sunlight shines on the inorganic solar energy absorption film 630 via the common substrate 611, light is converted into electricity. It is connected to the organic electroluminescent film 530 in the organic electroluminescent device 500 via an external loop (not shown). Electroluminescent light is generated and emitted from the common cover 651. The thickness of the negative electrode film 540 has to be controlled for the electroluminescent light to penetrate through.

Fourth Embodiment

Figure 13:
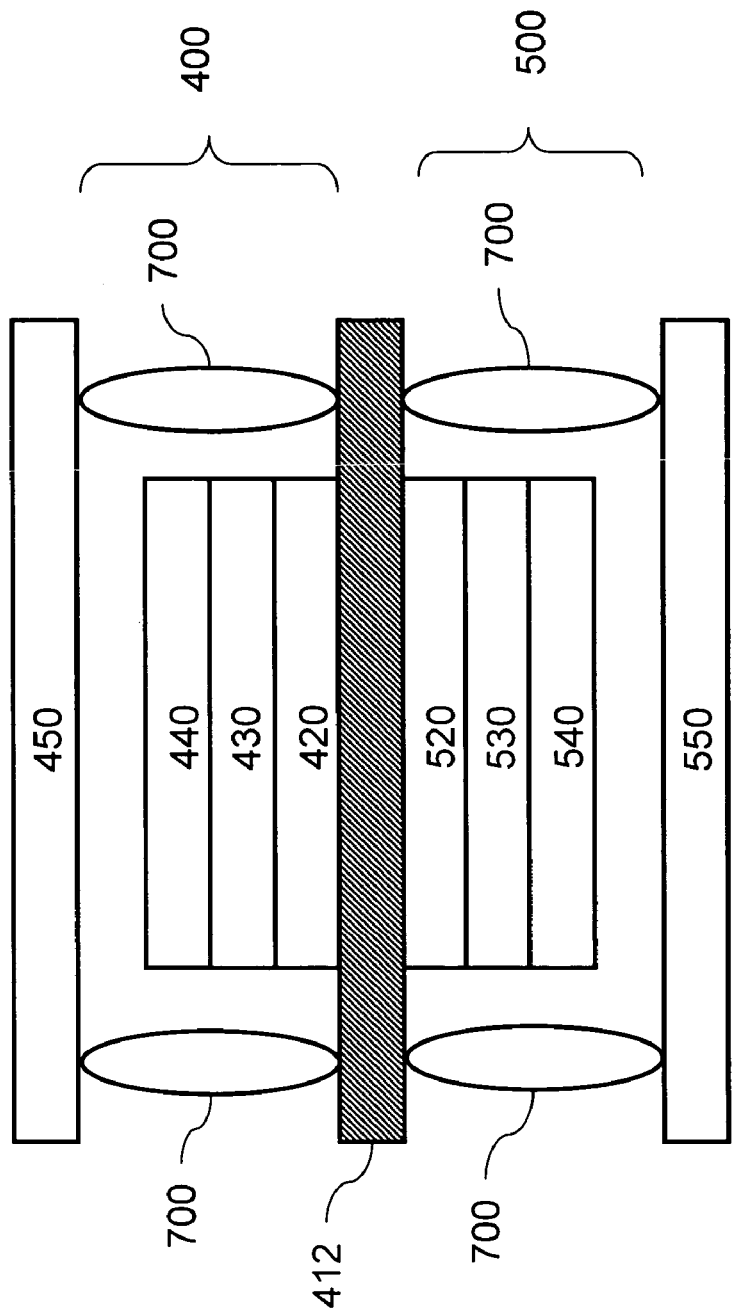
FIG. 13 is a schematic view of the fourth embodiment of the disclosed self-charging organic electroluminescent display that uses an organic solar cell.
Figure 14:
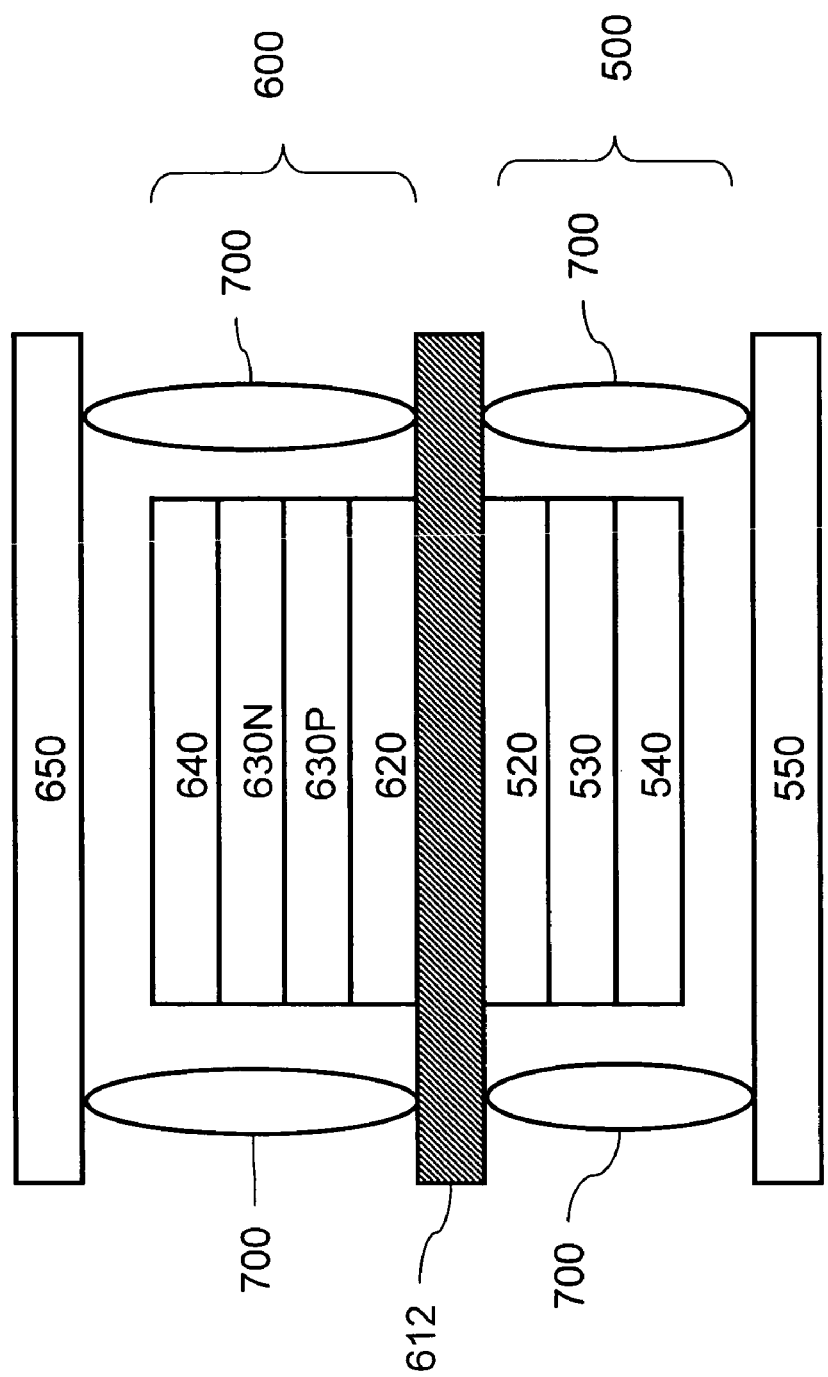
FIG. 14 is a schematic view of the fourth embodiment of the disclosed self-charging organic electroluminescent display that uses an inorganic solar cell.

Please refer to FIG. 13 for the fourth embodiment of the invention. An organic solar cell and an organic electroluminescent display are formed on different surfaces of a same substrate.

The organic solar cell 400 includes an opaque common substrate 412, a positive electrode film 420, an absorption film 430, and a negative electrode film 440. The organic electroluminescent device 500 contains a positive electrode film 520, an organic electroluminescent film 530, and a negative electrode film 540.

First, the positive electrode film 420 is coated on a first surface of the opaque common substrate 412. Afterwards, the absorption film 430 and the negative electrode film 440 are further coated thereon, forming an organic solar cell 400. A conductive film 520 is then coated on a second surface of the opaque common substrate 412. The first surface and the second surface are different ones. Finally, the organic electroluminescent film 530 and the negative electrode film 540 are coated, completing the organic electroluminescent device 500. Finally, a first cover 450, a second cover 550 and a packaging adhesive 700 are employed for packaging.

In the current embodiment, the organic solar cell can be replaced by an inorganic solar cell, which has the same structure and composition as in the previous embodiments.

The manufacturing process starts with coating the conductive film 620 on the first surface of the opaque common substrate 612 by evaporation. Afterwards, an inorganic P-type absorption film 630P, an inorganic N-type absorption film 630N, and a negative electrode film 640 are further coated by evaporation. The organic electroluminescent film 530 and the negative electrode film 540 are coated to complete the organic electroluminescent device 500. Finally, a first cover 650, a second cover 550, and a packaging adhesive are employed for packaging.

When sunlight shines on the inorganic solar energy absorption film 630 via the first cover 650, light is converted into electricity. It is connected to the organic electroluminescent film 530 in the organic electroluminescent device 500 via an external loop (not shown). Electroluminescent light is generated and emitted from the second cover 550. The thickness of the negative electrode film 640, 540 has to be controlled for the electroluminescent light to penetrate through.

Figure 15:
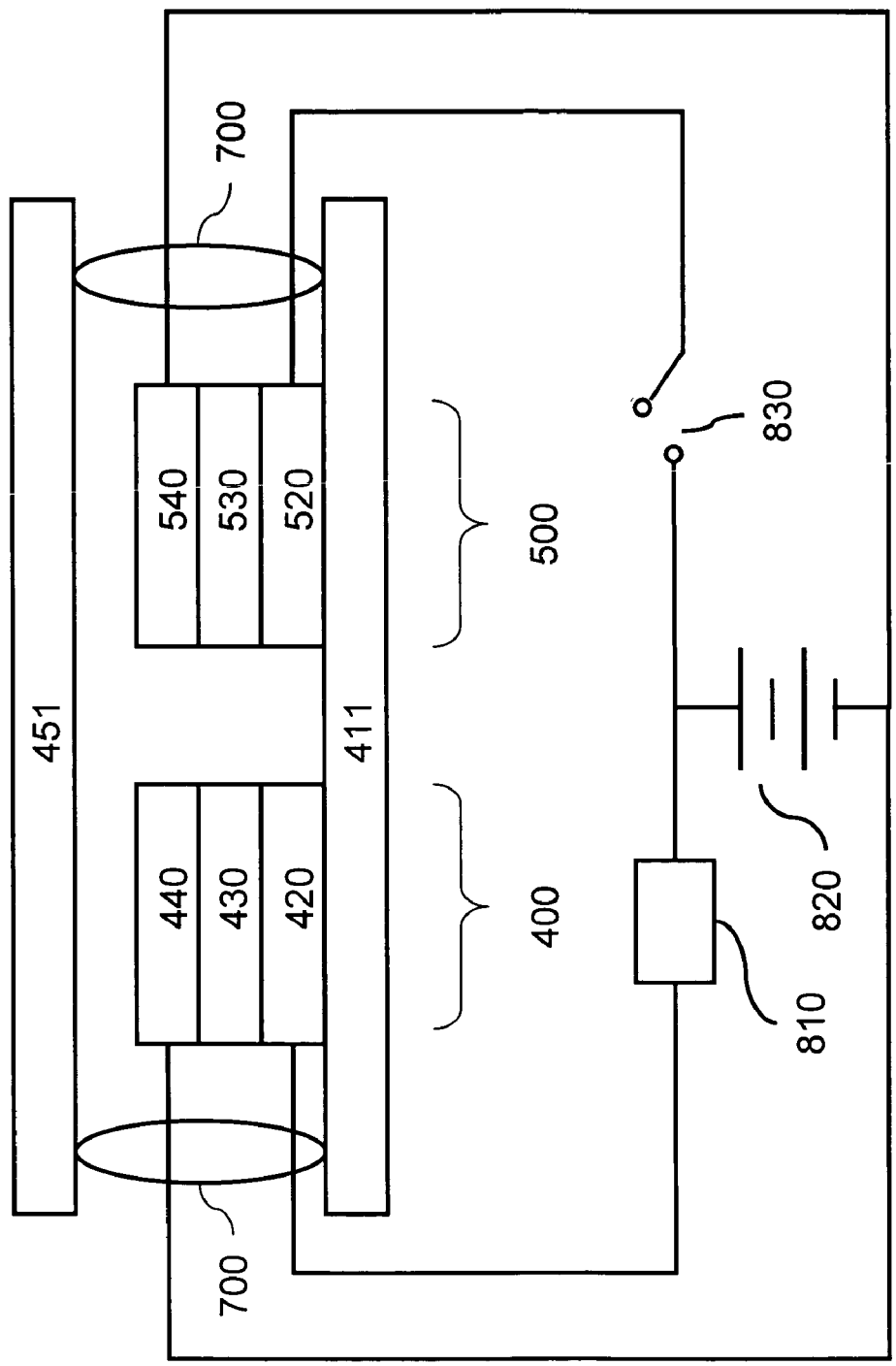
FIG. 15 is a circuit diagram of an external loop for the second embodiment of the invention.

Now we take the second embodiment of the invention as an example to explain the external loop design. With reference to FIG. 15, the positive electrode film 420 of the organic solar cell 400 is connected to a control switch 810. The negative electrode film 440 is connected to the negative electrode of a battery 820. The control switch 810 and the positive electrode of the battery are connected, forming a loop. The positive electrode film 520 of the organic electroluminescent device 500 is connected to a switch 830. The negative electrode film 540 is connected to the negative electrode of the battery 820, forming a loop.

When the organic solar cell 400 under the sunlight converts photo energy into electrical energy, the electricity is stored in the battery 820. Once the battery 820 is charged full, the control switch 810 shuts off the charging loop to stop the organic solar cell 400 from charging the battery 820. This prevents the battery from damages due to overcharging.

When the organic electroluminescent device 500 requires electricity, the switch 830 connects the battery 820 to the organic electroluminescent device 500. The switch 830 can be manual or connected to a sensor for automatic switching. For long-term uses or situations without sunlight, the invention can be connected to an external power supply, ensuring the stability of the device.

Figure 16:
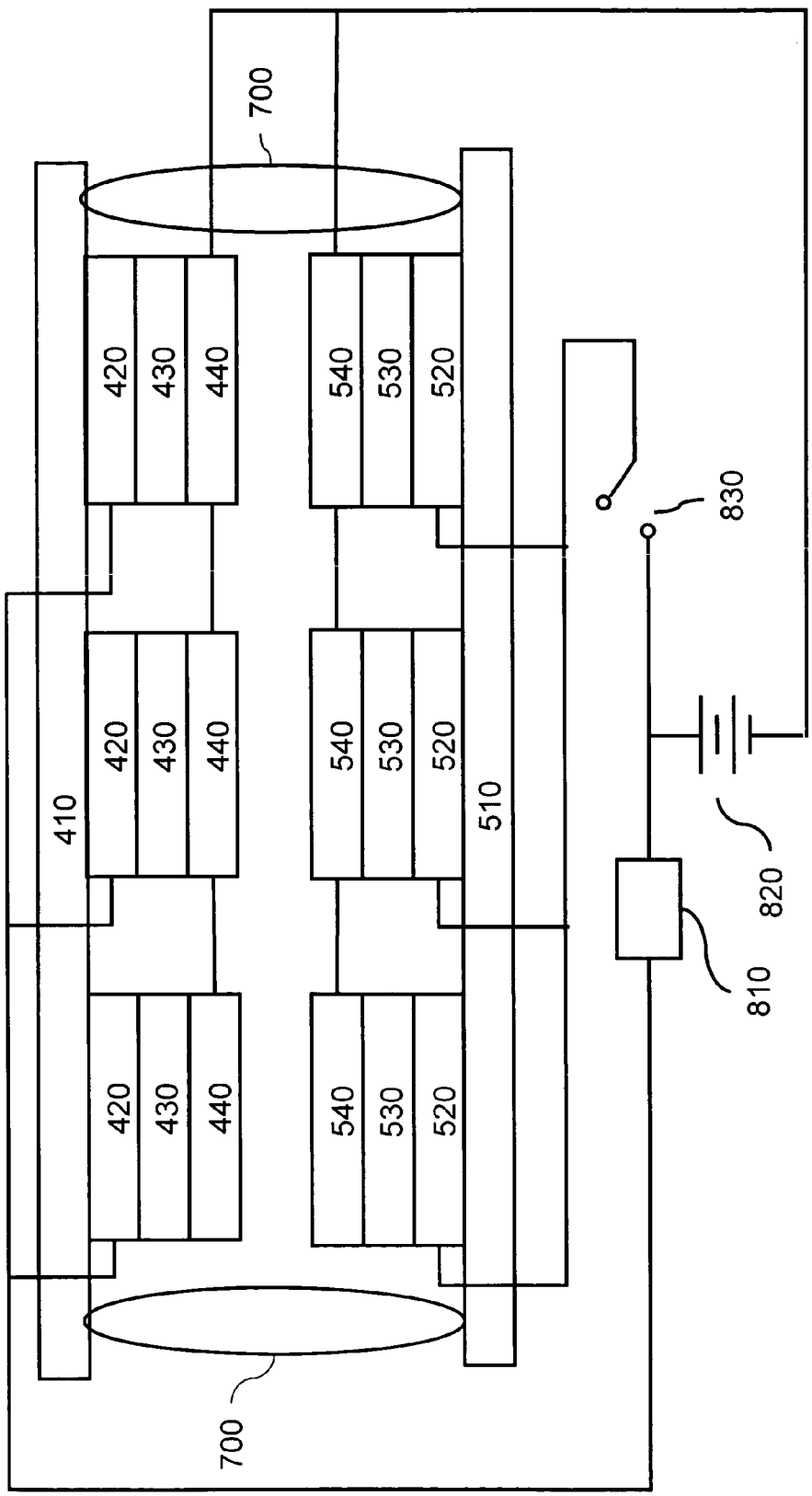
FIG. 16 is a schematic view of the first embodiment with multiple sets of organic electroluminescent devices and solar cells.

Take the first embodiment of the invention as an example, several sets of organic electroluminescent devices and solar cells are combined to form a display (see FIG. 16). As shown in the drawing, there are three sets of organic solar cells 400 and organic electroluminescent devices 500 coated on a first substrate 410 and a second substrate 510. The positive and negative electrodes of each solar cell 400 are connected to a control switch 810 and a battery 820, respectively, to form a closed loop. Therefore, the solar energy can be converted to charge the battery 820. The positive and negative electrodes of the three sets of organic electroluminescent devices 500 are connected to a switch 830 and the battery 820 to form a loop. When the display is functioning, the battery 830 provides the electrical energy. One can generalize the current embodiment to include more sets of organic electroluminescent devices and solar cells to make a display.

Figure 17:
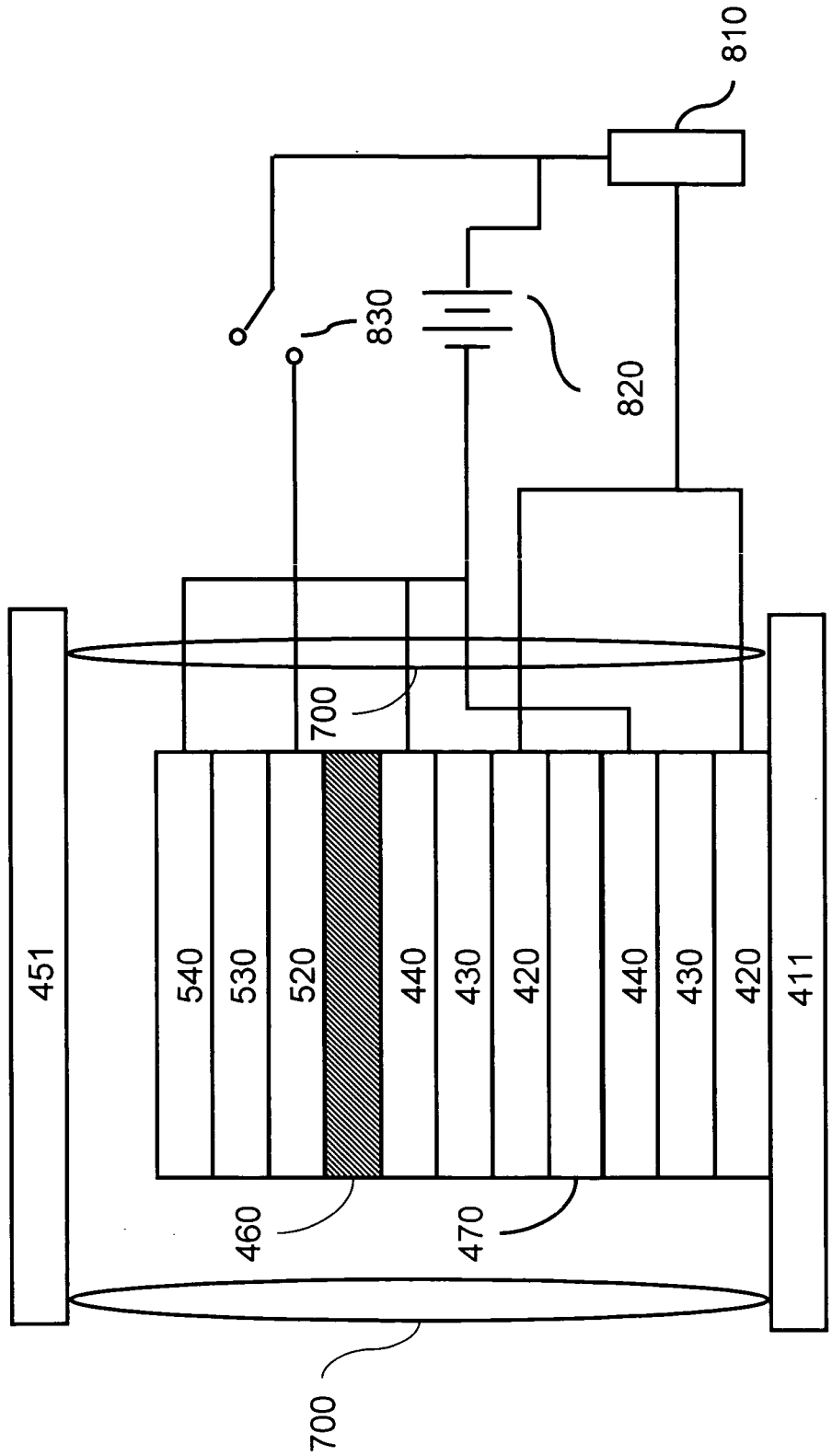
FIG. 17 is a schematic view of the third embodiment with multiple sets of solar cells.

FIG. 17 is a schematic view of the structure with multiple sets of solar cells in the third embodiment. As shown in the drawing, two sets of organic solar cells 400 are stacked on a common substrate 411, separated by a transparent insulating layer 470. The transparent insulating layer 470 is formed from SiOx, or SiNx, or other polymer insulating materials by vacuum evaporation. An opaque insulating layer 460 and an organic electroluminescent device 500 are further coated above the top organic solar cell 400 by evaporation to obtain a self-charging organic electroluminescent display. The opaque insulating layer 460 is an opaque polymer film. The positive and negative electrodes of the two sets of organic solar cells 400 are connected to a control switch 810 and a battery 820 to form a closed loop. Therefore, the solar cell can charge the battery 820. The positive and negative electrodes of the organic electroluminescent device 500 are connected to a switch 830 and the battery 820 to form a loop. The battery 830 provides the necessary electrical power for the display to function. One can generalize the current embodiment to include more sets of solar cells to make a display.

Certain variations would be apparent to those skilled in the art, which variations are considered within the spirit and scope of the claimed invention.

What is claimed is:

1. A self-charging organic electroluminescent display module, comprising:
    a common substrate;
    at least one solar cell formed on the common substrate;
    an opaque insulating layer formed on the solar cell; and
    an organic electroluminescent device formed on the opaque insulating layer;
    wherein the solar cell provides necessary electrical power for the organic electroluminescent device to function and the common substrate, the solar cell, and the organic electroluminescent device are packaged together.

2. The self-charging organic electroluminescent display module of claim 1, further comprising a common cover corresponding to the locations of the solar cell and the organic electroluminescent device, wherein a packaging adhesive is employed to combine the common substrate and the common cover.

3. The self-charging organic electroluminescent display module of claim 1, wherein the solar cell is an inorganic solar cell.

4. The self-charging organic electroluminescent display module of claim 1, wherein the solar cell is an inorganic solar cell.

* * * * *